(12) United States Patent
Lin et al.

(10) Patent No.: US 8,136,245 B2
(45) Date of Patent: Mar. 20, 2012

(54) METHOD FOR COMBINING HEAT PIPES WITH A FIXING BASE

(75) Inventors: Kuo-Len Lin, Wugu Township, Taipei County (TW); Chen-Hsiang Lin, Wugu Township, Taipei County (TW); Hwai-Ming Wang, Wugu Township, Taipei County (TW); Ken Hsu, Wugu Township, Taipei County (TW); Chih-Hung Cheng, Wugu Township, Taipei County (TW)

(73) Assignees: Cpumate Inc., Taipei County (TW); Golden Sun News Techniques Co., Ltd., Taipei County (TW)

( * ) Notice: Subject to any disclaimer, the term of this patent is extended or adjusted under 35 U.S.C. 154(b) by 585 days.

(21) Appl. No.: 12/272,045

(22) Filed: Nov. 17, 2008

(65) Prior Publication Data

US 2010/0122799 A1    May 20, 2010

(51) Int. Cl.
*B21D 53/02* (2006.01)

(52) U.S. Cl. ......... 29/890.032; 29/890.038; 29/890.043; 29/890.045

(58) Field of Classification Search ............. 29/890.032, 29/890.038, 890.043, 890.045, 890.046, 29/890.047
See application file for complete search history.

(56) References Cited

U.S. PATENT DOCUMENTS

2006/0196050 A1* 9/2006 Fujimori et al. ......... 29/890.035
2007/0261244 A1* 11/2007 Cheng et al. ............... 29/890.03

* cited by examiner

*Primary Examiner* — David Bryant
*Assistant Examiner* — Christopher Besler
(74) *Attorney, Agent, or Firm* — Chun-Ming Shih; HDLS IPR Services

(57) ABSTRACT

In a method for juxtaposing and combining a plurality of heat pipes with a fixing base, first, a fixing base having an accommodating trough is provided. The accommodating trough is provided therein with at least one recess. Further, a plurality of heat pipes is provided. Adhesive medium is coated on the contacting surface between the heat pipe and the accommodating trough. The plurality of heat pipes is pressed into the accommodating trough. Finally, the heat pipes juxtaposed in the accommodating trough are pressed coplanarly the surface of the fixing base while a portion of the adhesive medium is received in the recess.

7 Claims, 10 Drawing Sheets

METHOD FOR COMBINING HEAT PIPES WITH A FIXING BASE

BACKGROUND OF THE INVENTION

1. Field of the Invention

The present invention relates to a heat-conducting device, and in particular to a technique for combining a plurality of heat pipes with a fixing base to form a plane.

2. Description of Prior Art

Since heat pipes have many advantages such as high heat-conducting capacity, low weight, simple structure, no power consumption, low price or the like, they have been widely used in conducting the heat generated by electronic elements. By means of conducting the heat generated by electronic heat-generating elements rapidly, the heat accumulation in an electronic heat-generating element at current stage can be overcome efficiently.

Please refer to FIG. 1, which is a schematic view showing the conventional combination of heat pipes and a heat-conducting base (fixing base). A partition 102a is formed between each groove 101a on the heat-conducting base 10a, so that the heat pipes 20a can be arranged on the heat-conducting base 10a at intervals. Although these partitions 102a allow each heat pipe 20a to be received in the grooves 101a respectively, the number of the heat pipes 20a that can be disposed on the heat-conducting base 10a is reduced when an evaporator section 201a of each heat pipe 20a is attached to a heat-generating element. As a result, the contacting area between the evaporator section 201a of the heat pipes 20a and the heat-generating element is reduced, which may affect the heat-conducting efficiency of the heat pipe 20a with respect to the heat-generating element.

In order to overcome the above drawbacks, the present Inventor proposes a method for juxtaposing and combining heat pipes with a fixing base as well as the structure of the same. As shown in FIG. 2, a fixing base 10b having an accommodating trough 12b on its bottom surface 11b and at least two heat pipes 20b are provided. Then, the heat pipes 20b are disposed in the accommodating trough 12b. Finally, the heat pipes 20b in the accommodating trough 12b are subjected to a machining process, thereby forming into a plane 200b. In this way, the heat pipes 20b can be juxtaposed orderly and combined with the fixing base 10b, thereby enlarging the contacting area between the heat pipes and the heat-generating element.

However, in practice, the above structure of juxtaposing and combing heat pipes with a fixing base still has some drawbacks. Since the heat pipes are subjected to a machining process and thus compressed into the accommodating trough forcibly of the fixing base, no adhesive medium is applied between the heat pipes and the fixing base to generate a fixing effect. Therefore, after the product is finished, part of the heat pipes disposed in the fixing base may be loosened during the transportation or safety test. As a result, the flatness of the plane formed by the juxtaposed heat pipes is lowered, which reduces the heat-conducting efficiency or even cannot operate normally, Thus, it is an important issue for the present Inventor to solve the above problems.

SUMMARY OF THE INVENTION

The present invention is to provide a method for combining heat pipes with a fixing base and a structure of the same, whereby the heat pipes can be adhered in the accommodating trough of the fixing base tightly.

The present invention is to provide a method for combining heat pipes with a fixing base and a structure of the same. With at least one recess being provided in the accommodating trough, a portion of the adhesive medium can be received therein. Therefore, it is not necessary to control the supplied amount of adhesive medium accurately. On the other hand, excess adhesive medium will not overflow to contaminate the surface of the heat pipes or the fixing base.

The present invention is to provide a method for combining heat pipes with a fixing base. First, a fixing base having an accommodating trough is provided. At least one recess is provided in the accommodating trough. Further, a plurality of heat pipes is provided. The contacting area between the heat pipes and the accommodating trough is coated with adhesive medium. Then, a plurality of heat pipes is pressed into the accommodating trough forcibly. Finally, the juxtaposed heat pipes are pressed into the accommodating trough, so that the heat pipes form a plane coplanarly the surface of the fixing base with a portion of the adhesive medium being received in the recess.

The present invention is to provide a structure for combining heat pipes with a fixing base, which includes a fixing base having an accommodating trough on its bottom surface and at least two heat pipes. The accommodating trough of the fixing base is provided therein with at least one recess. A plurality of juxtaposed heat pipes is pressed into the accommodating trough. The surface of the heat pipes is pressed coplanarly the surface of the fixing base. The contacting surface between the heat pipes and the accommodating trough is coated with adhesive medium with a portion of the adhesive medium being received in the recess.

DETAILED DESCRIPTION OF THE INVENTION

The detailed description and technical contents of the present invention will be explained with reference to the accompanying drawings. However, the drawings are illustrative only but not used to limit the present invention.

Figure 1:
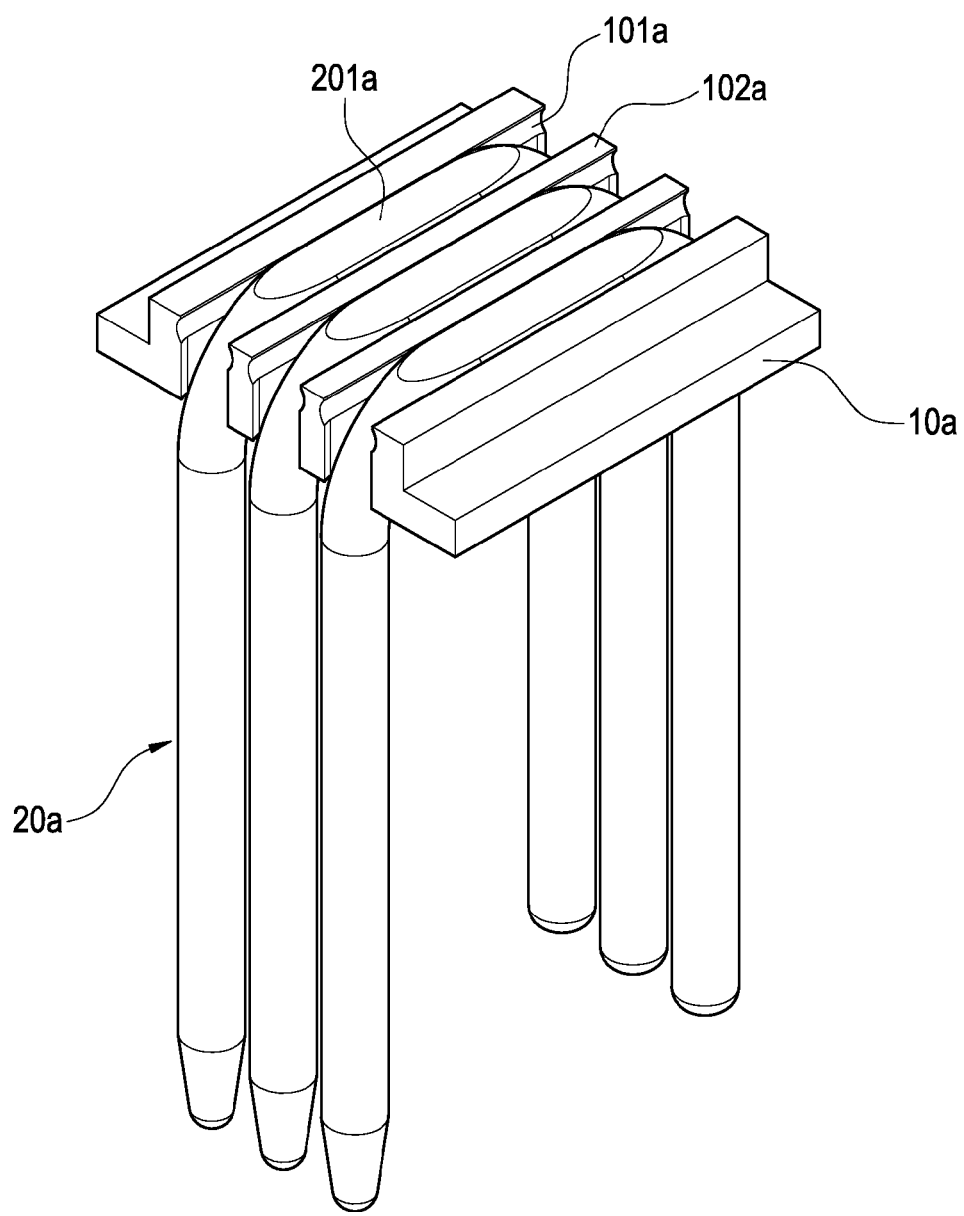
FIG. 1 is a schematic view showing the conventional combination of heat pipes with a heat-conducting base.
Figure 2:
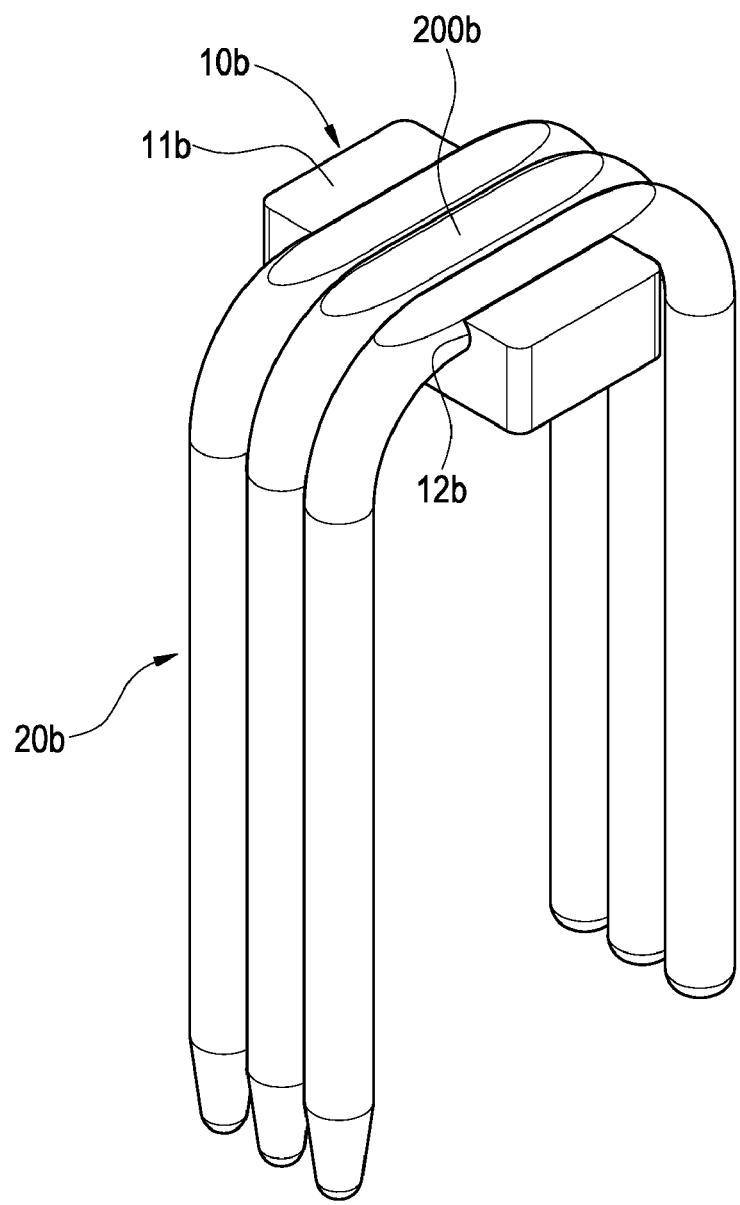
FIG. 2 is a schematic view showing an external appearance of the combination of the heat pipes and the fixing base.
Figure 3A:
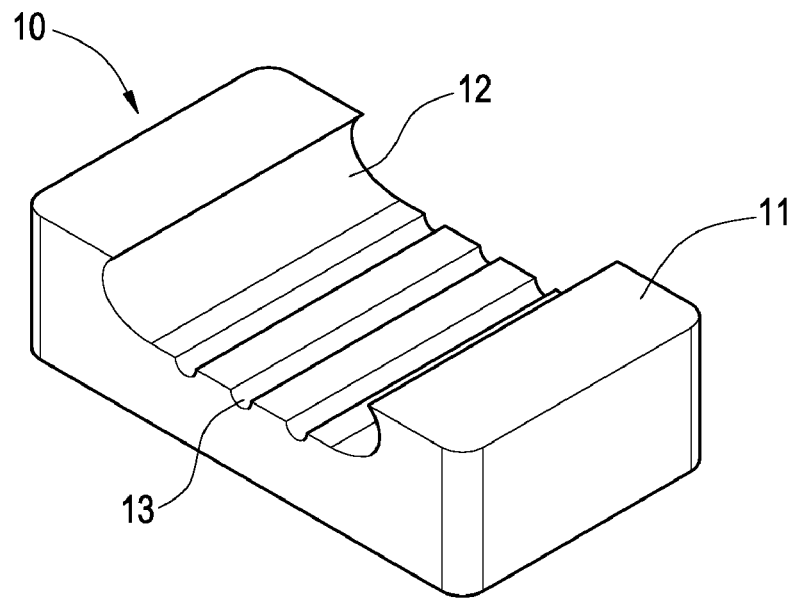
FIG. 3A is a perspective view showing the external appearance of the fixing base having an elongate slot according to the present invention.
Figure 3B:
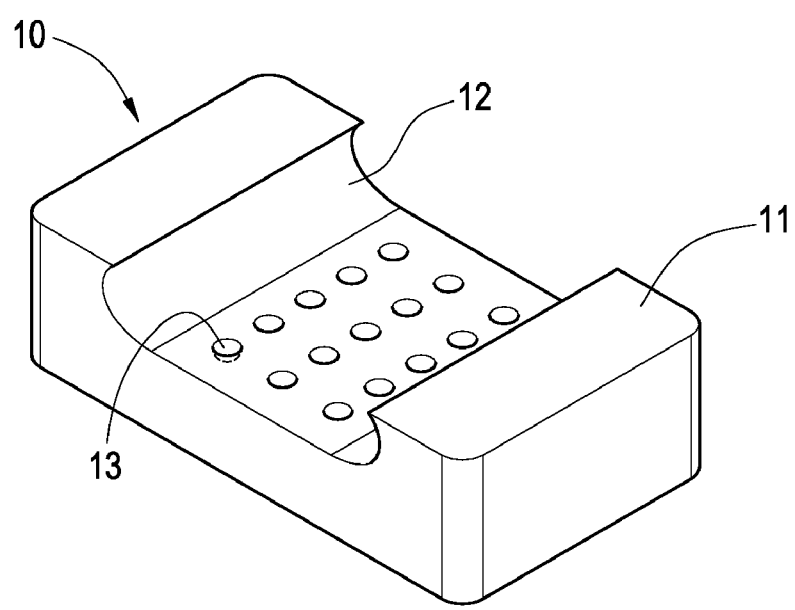
FIG. 3B is a perspective view showing the external appearance of the fixing base having a hole according to the present invention.
Figure 4:
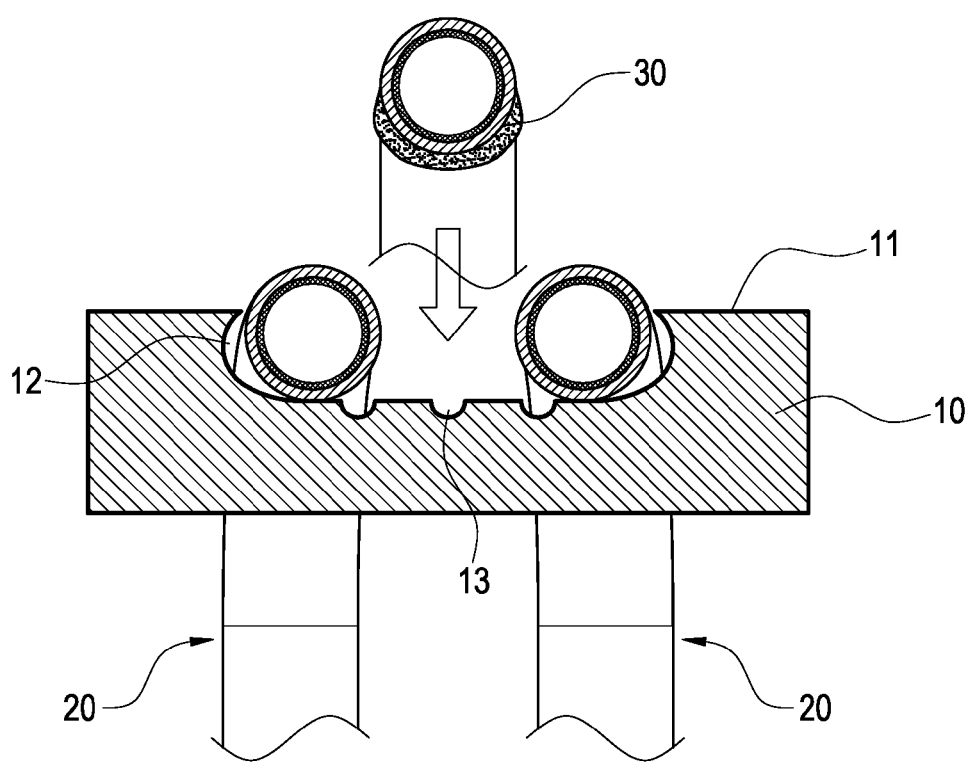
FIG. 4 is a cross-sectional view showing a surface of the heat pipe coated with adhesive medium according to the present invention.
Figure 5:
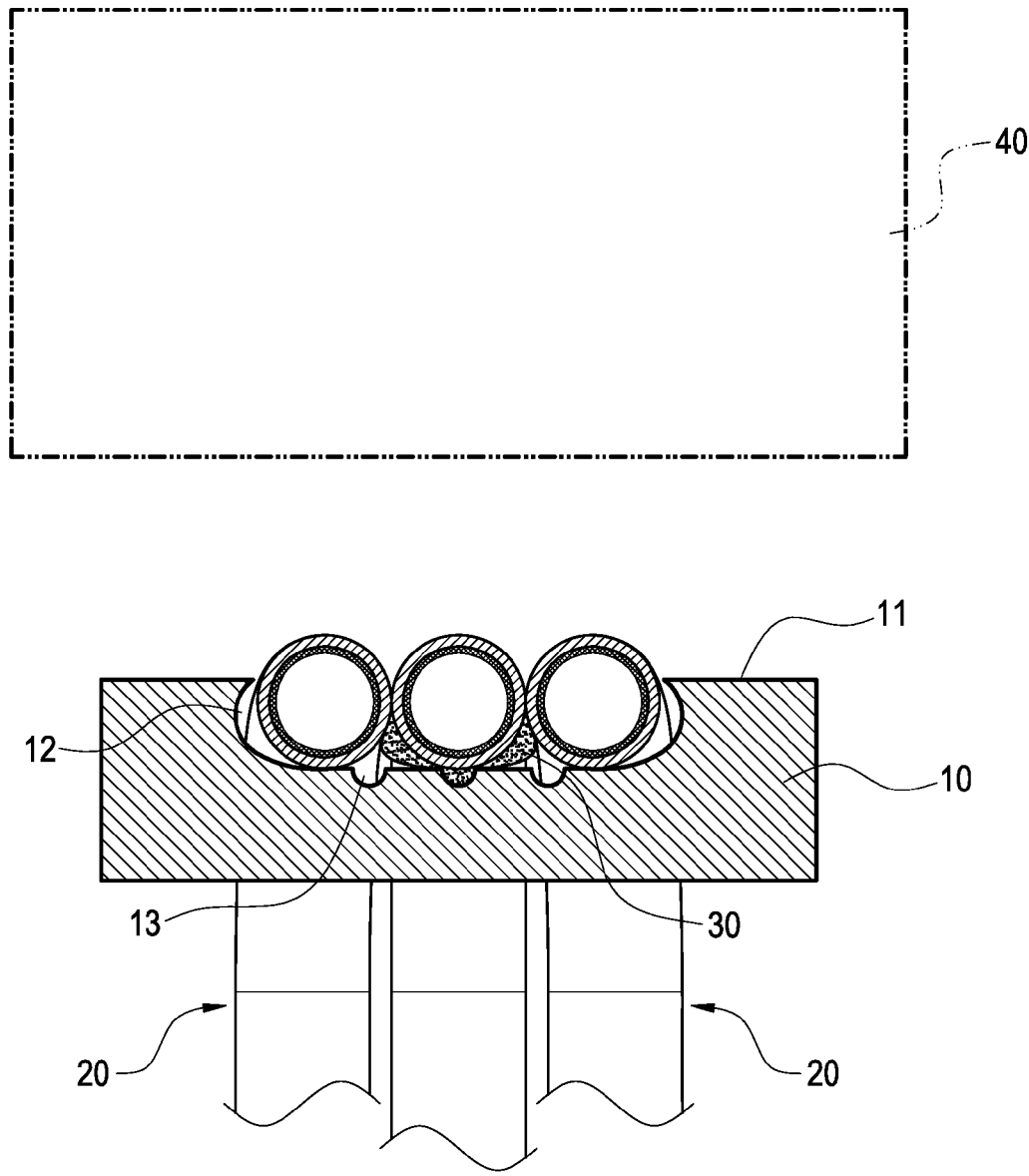
FIG. 5 is a cross-sectional view showing a heat pipe coated with adhesive medium being pressed in the accommodating trough according to the present invention.
Figure 6:
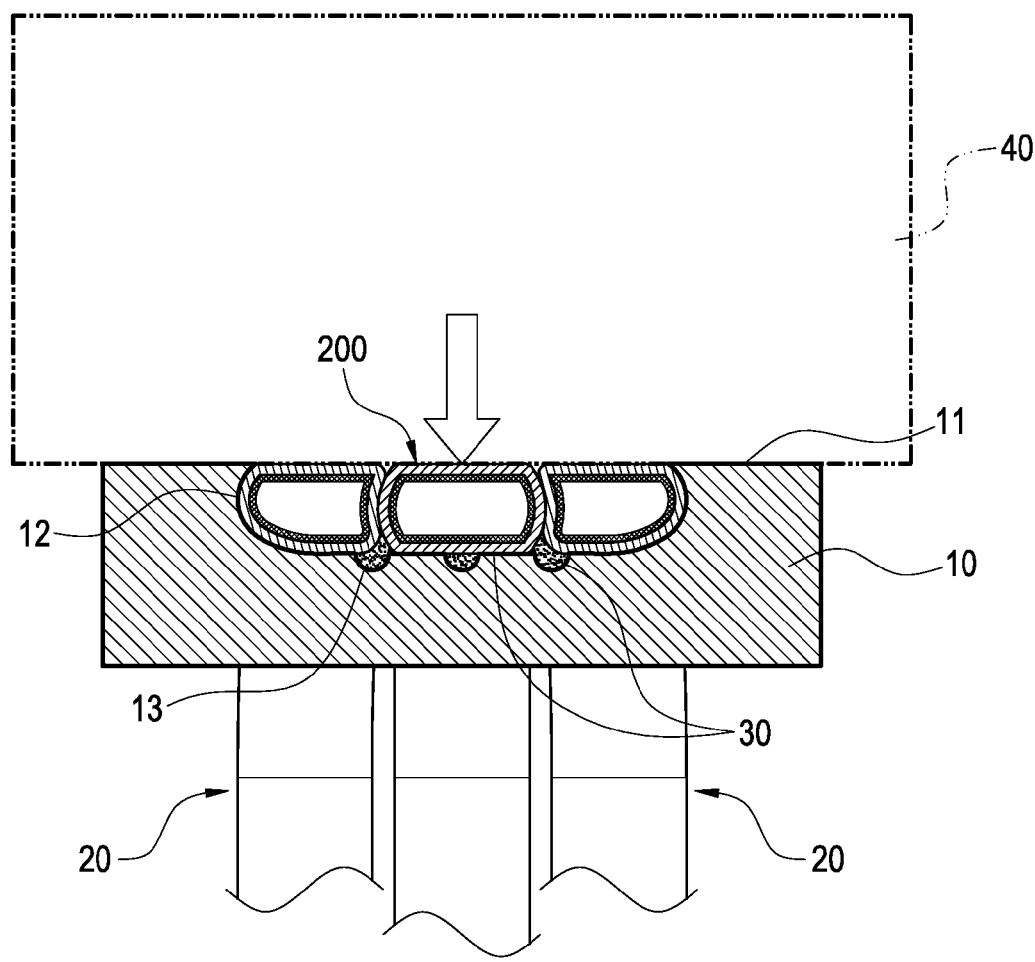
FIG. 6 is a schematic view showing the pressed and juxtaposed heat pipes of the present invention.

Please refer to FIGS. 3A, 3B to 6, which show the first embodiment of the present invention. The present invention provides a method for combining heat pipes with a fixing base. First, a fixing base 10 having an accommodating trough 12 is provided. The accommodating trough 12 is provided with at least one recess 13. The recess 13 may be an elongate slot (FIG. 3A) or a hole (FIG. 3B). Further, at least two heat pipes 20 are provided (in the present embodiment, three heat pipes 20 are provided, but the number of heat pipes can be adjusted based on practical demands). The contacting surface between the heat pipes 20 and the accommodating trough 12 is coated with adhesive medium 30. The adhesive medium 30 may be epoxy resin, heat-conducting paste, heat-conducting glue or the like. The adhesive medium 30 is applied to the surface of the heat pipe 20 (one or more heat pipes), or it can be applied to the surface of the accommodating trough 12. Then, the heat pipes 20 are pressed into the accommodating trough 12. In the present embodiment, two of the heat pipes 20 are disposed in the accommodating trough 12 first, and then the at least one heat pipe 20 is pressed into the accommodating trough 12 with a portion of the adhesive medium 30 being received in the recess 13. In practice, the heat pipes 20 are juxtaposed in the opening of the accommodating trough 12, and then the juxtaposed heat pipes 20 are all pressed in the accommodating trough 12 simultaneously. Finally, the juxtaposed heat pipes 20 are pressed, so that the heat pipes 20 totally form a plane 20 that is coplanarly the surface of the fixing base 10. In the present embodiment, a die 40 is used to roll the heat pipes 20 in the accommodating trough 12, thereby combining the juxtaposed heat pipes 20 in the accommodating trough 12 of the fixing base 10.

Figure 7:
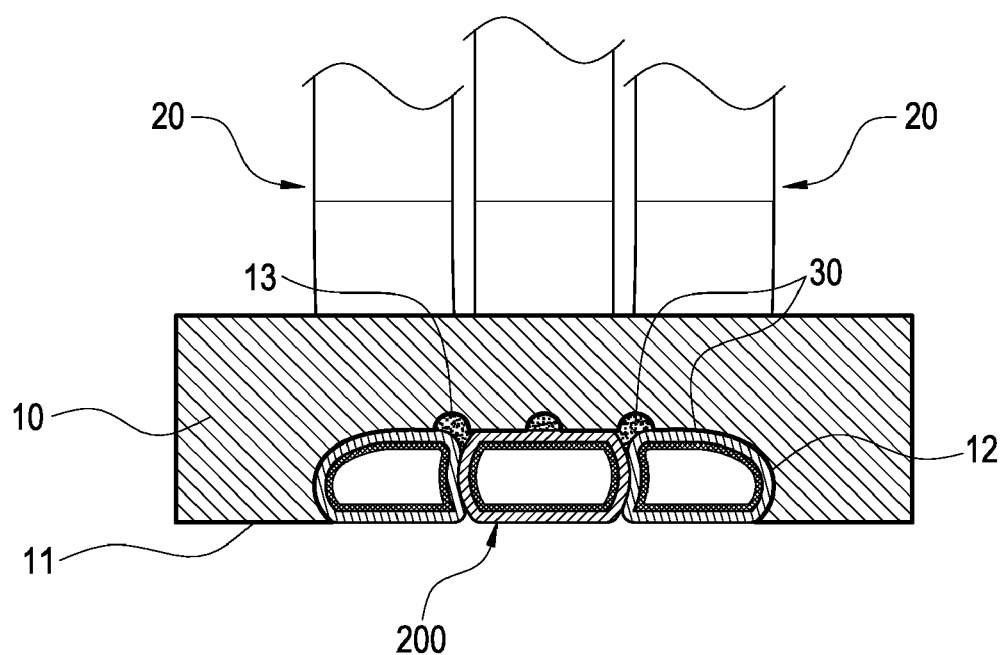
FIG. 7 is a cross-sectional view showing the combination of heat pipes and the fixing base according to the first embodiment of the present invention.

Please refer to FIG. 7, which is a cross-sectional view showing the combination of heat pipes and a fixing base. In a product obtained according to the above procedure, the bottom surface 11 of the fixing base 10 has the accommodating trough 12. The accommodating trough 12 is provided with a plurality of recesses 13. The plurality of heat pipes 20 are juxtaposed and pressed into the accommodating trough 12. The contacting surface between the heat pipes 20 and the accommodating trough 12 is coated with the adhesive medium 30. A portion of the adhesive medium 30 is received in the recess 13. In the present embodiment, there are three heat pipes 20. The three heat pipes 20 in the accommodating trough 12 are pressed to form a plane 200 that is coplanarly the surface of the fixing base 10. In practice, the plane 200 may higher than the bottom surface 11 of the fixing base 10.

Figure 8:
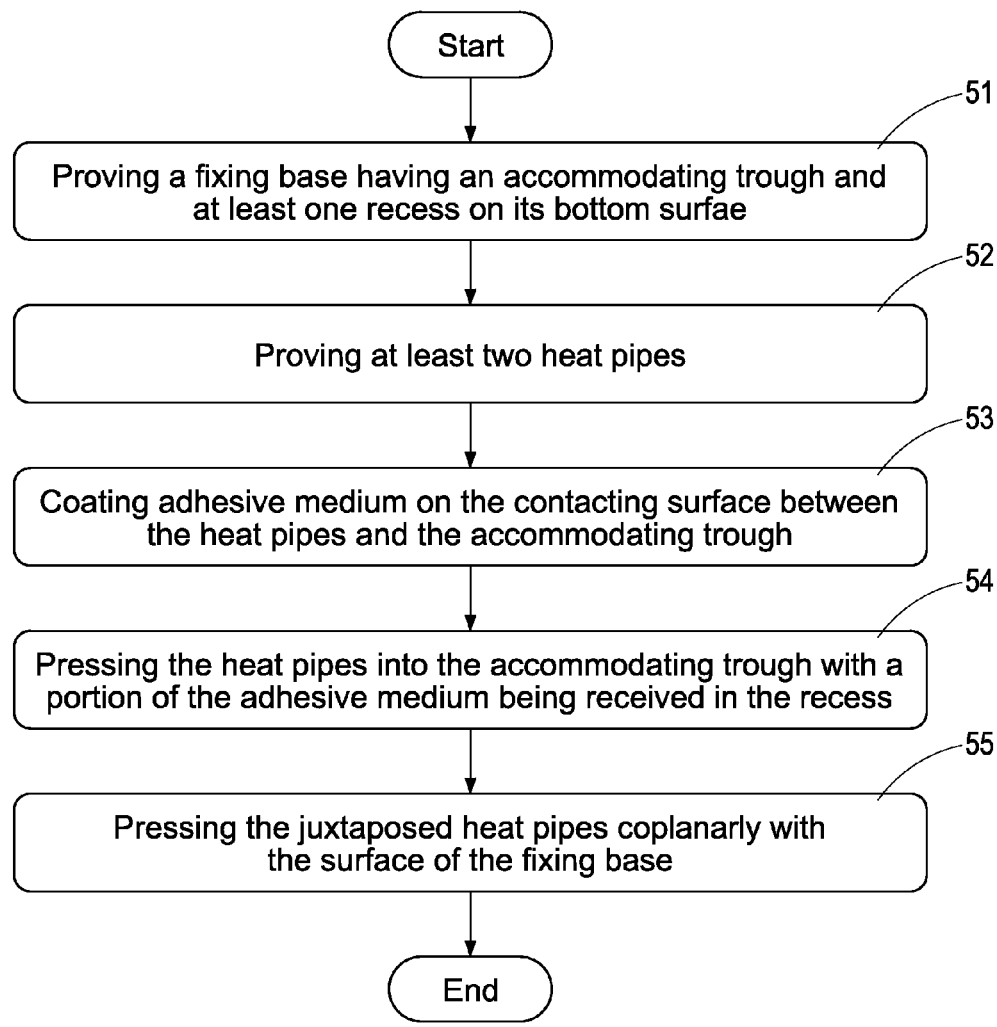
FIG. 8 is a flow chart showing the method according to the first embodiment of the present invention.

Please refer to FIG. 8, which is a flow chart showing the method according to the first embodiment of the present invention (please also refer to FIGS. 3A to 7). The method includes the steps as follows. First, a fixing base 10 having an accommodating trough 12 on its bottom surface 11 is provided. The accommodating trough 12 is provided therein with at least one recess 13 (Step 51). The recess 13 may be an elongate slot or a hole. Further, at least two heat pipes 20 are provided (Step 52). Then, the contacting surface between the heat pipes 20 and the accommodating trough 12 is coated with adhesive medium 30 (Step 53). The adhesive medium 30 may be epoxy resin, heat-conducting paste, heat-conducting glue or the like. The adhesive medium 30 is applied to the surface of the heat pipe 20, or it can be applied to the surface of the accommodating trough 12. Then, the heat pipes 20 are disposed in the accommodating trough 12 with a portion of the adhesive medium 30 being received in the recess 13 (Step 54). At this time, the heat pipes 20 can be adhered in the accommodating trough 12 tightly via the adhesive medium 30, while a portion of the adhesive medium 30 is received in the recess 13. Finally, via a machining process, a rolling die 40 is used to press the heat pipes 20 juxtaposed in the accommodating trough 12 at least one time, so that the heat pipes 20 form a plane 200 that is coplanarly the surface of the fixing base 10 (Step 55). In the present embodiment, the way of disposing the heat pipes 20 in the accommodating trough 12 is to first dispose two of the heat pipes 20 in the accommodating trough 12, and then pressing the at least one heat pipe 20 into the accommodating trough 12. Alternatively, the heat pipes 20 are juxtaposed in the opening of the accommodating trough 12, and then the juxtaposed heat pipes 20 are pressed into the accommodating trough 12 simultaneously.

Figure 9:
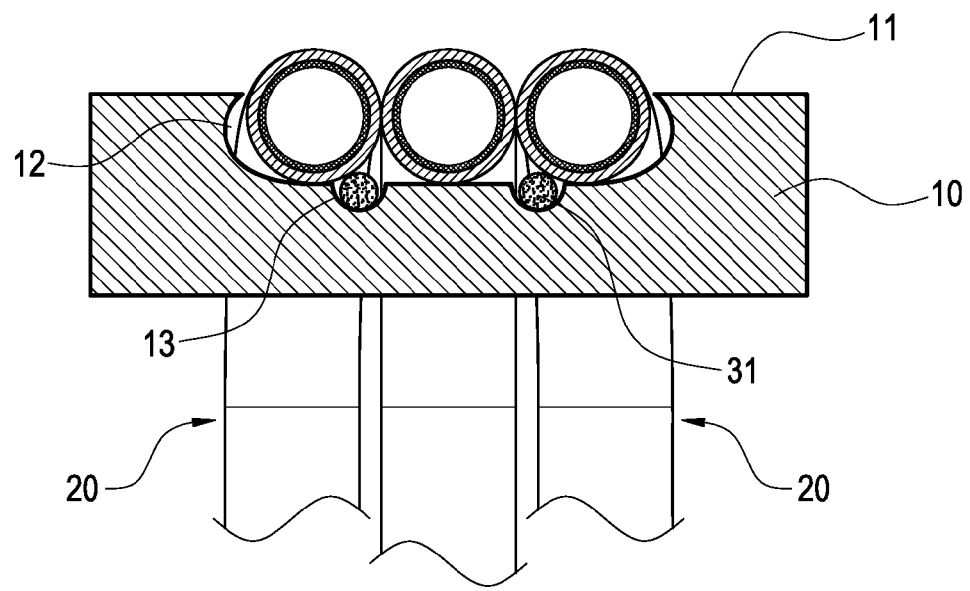
FIG. 9 is a cross-sectional view showing the state in which thermosetting adhesive medium is disposed in the recess and the heat pipes are pressed in the accommodating trough according to the present invention.
Figure 10:
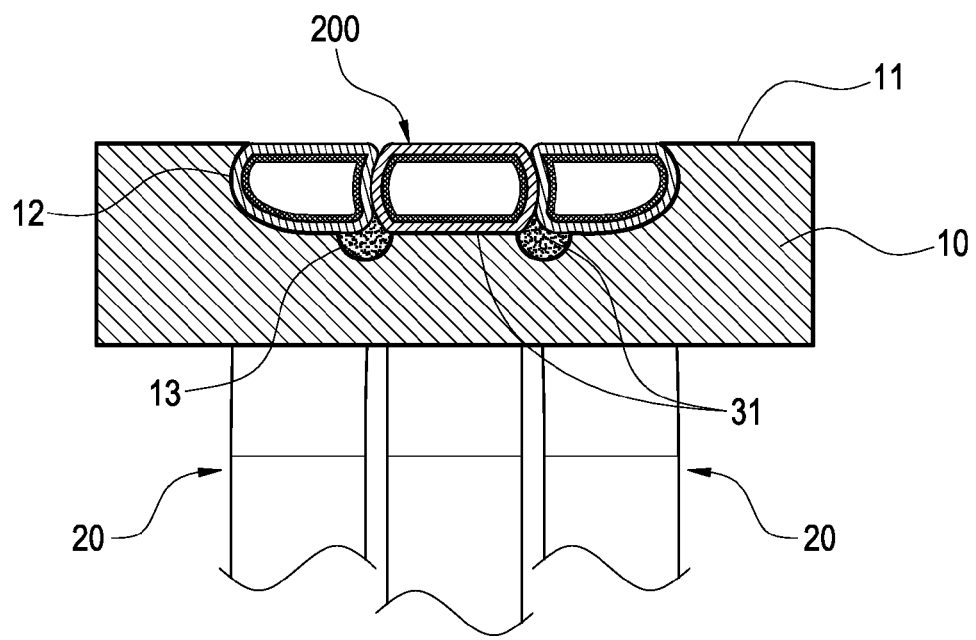
FIG. 10 is a cross-sectional view showing the combination of heat pipes and the fixing base according to the second embodiment.

Please refer to FIGS. 9 and 10, which show the second embodiment of the present invention. The second embodiment is substantially the same as the first embodiment. The bottom surface 11 of the fixing base 10 has an accommodating trough 12. The accommodating trough 12 is provided therein with at least one recess 13. The recess 13 may be an elongate slot or a hole. The difference between the second embodiment and the first embodiment lies in that thermosetting adhesive medium 31 is disposed in the recess 13. When the recess 13 is an elongate slot, elongate adhesive medium 31 (such as wires or tin stripes) can be disposed therein. On the other hand, when the recess 13 is a hole, spherical or block-like adhesive medium 31 (such as metallic particles or tin particles) can be disposed therein. Then, the heat pipes 20 are disposed in the accommodating trough 12. Thereafter, the juxtaposed heat pipes 20 are pressed coplanarly the surface of the fixing base 10. Finally, the adhesive medium 31 is heated to melt, so that the molten adhesive medium 31 flows into the contacting surface between the accommodating trough 12 and the heat pipe 20. A portion of the adhesive medium 31 is received in the recess 13. After the adhesive medium 31 is solidified, the heat pipes 20 can be adhered into the accommodating trough 12 tightly via the adhesive medium 31.

Figure 11:
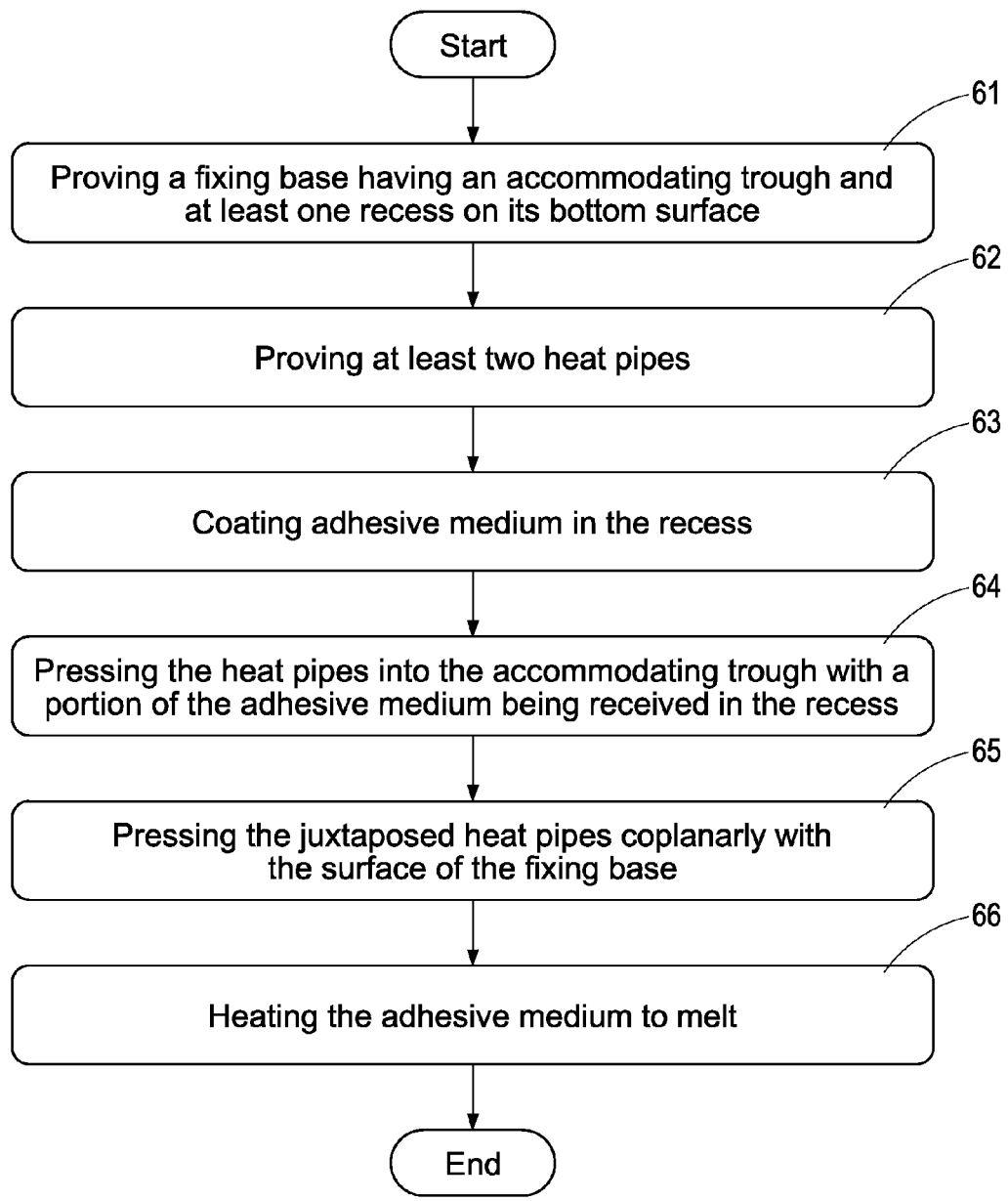
FIG. 11 is a flow chart showing the method according to the second embodiment of the present invention.

Please refer to FIG. 11, which is a flow chart showing the method of the second embodiment of the present invention (please also refer to FIGS. 9 to 11). The steps of the second embodiment are substantially the same as those of the first embodiment. The only difference lies in that thermosetting adhesive medium 31 is disposed in the recess 13 (Step 63). When the recess 13 is an elongate slot, elongate adhesive medium 31 (such as wires or tin stripes) can be disposed therein. On the other hand, when the recess 13 is a hole, spherical or block-like adhesive medium 31 (such as metallic particles or tin particles) can be disposed therein. Then, the heat pipes 20 are disposed in the accommodating trough 12 (Step 64). Thereafter, the juxtaposed heat pipes 20 are pressed coplanarly the surface of the fixing base 10 (Step 65). Finally, the adhesive medium 31 is heated to melt (Step 66), so that the molten adhesive medium 31 flows into the contacting surface between the accommodating trough 12 and the heat pipes 20. A portion of the adhesive medium 31 is received in the recess 13. After the adhesive medium 31 is solidified, the heat pipes 20 can be adhered into the accommodating trough 12 tightly via the adhesive medium 31.

In the method for combining heat pipes with a fixing base and the structure of the same according to the present invention, the contacting surface between the heat pipes and the accommodating trough is coated with adhesive medium, so that the heat pipes can be adhered in the accommodating trough of the fixing base tightly, thereby maintaining the flatness of the plane formed by the heat pipes and the heat-conducting efficiency of the heat pipes. Further, since a portion of the adhesive medium can be received in the recess of the accommodating trough, it is unnecessary to control the supplied amount of adhesive medium accurately. Excess adhesive medium will not overflow to contaminate the heat pipes or the surface of the fixing base.

Although the present invention has been described with reference to the above preferred embodiments, these embodiments are not intended to limit the scope of the present invention. Equivalent changes may be made without departing from the spirit and scope of the present invention. Therefore, such changes still fall into the scope defined by the appended claims.

What is claimed is:

1. A method for combining heat pipes (20) with a fixing base (10), comprising the steps of:
   a) providing the fixing base (10) having a single accommodating trough (12) on a bottom surface (11) thereof, the accommodating trough (12) being provided therein with at least one recess (13);
   b) providing at least two heat pipes (20);
   c) coating adhesive medium (30) on a contacting surface of at least one heat;
   d) disposing the other heat pipe in the accommodating trough (12) and pushing the at least one heat pipe with the coating adhesive medium (30) into the accommodating trough (12), the recess (13) being located on a surface of the accommodating trough (12) between the at least two heat pipes; and
   e) pressing the at least two heat pipes (20) juxtaposed in the accommodating trough (12), thereby making the at least two heat pipes (20) coplanar with the bottom surface of the fixing base (10), and the coating adhesive medium being filled in the recess and a gap between the at least two heat pipes so that the at least two heat pipes are adhered together and with the surface of the accommodating through.

2. The method according to claim 1, wherein the recess (13) is a hole.

3. The method according to claim 1, wherein the recess (13) is an elongate slot.

4. The method according to claim 1, wherein the adhesive medium (30) is epoxy resin.

5. The method according to claim 1, wherein the adhesive medium (30) is heat-conducting glue.

6. The method according to claim 1, wherein the adhesive medium (30) is thermosetting adhesive medium.

7. The method according to claim 6, further comprising a step f) of heating the adhesive medium (30) to melt.

* * * * *